(12) United States Patent
Han et al.

(10) Patent No.: US 8,947,113 B2
(45) Date of Patent: Feb. 3, 2015

(54) METHODS FOR MODELING TUNABLE RADIO-FREQUENCY ELEMENTS

(75) Inventors: Liang Han, Sunnyvale, CA (US);
Jayesh Nath, Santa Clara, CA (US);
Matthew A. Mow, Los Altos, CA (US);
Peter Bevelacqua, Cupertino, CA (US);
Joshua G. Nickel, San Jose, CA (US);
Mattia Pascolini, Campbell, CA (US);
Robert W. Schlub, Cupertino, CA (US);
Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 299 days.

(21) Appl. No.: 13/466,017

(22) Filed: May 7, 2012

(65) Prior Publication Data
US 2013/0293249 A1  Nov. 7, 2013

(51) Int. Cl.
*G01R 31/00* (2006.01)

(52) U.S. Cl.
USPC ..................................... 324/750.02; 324/650

(58) Field of Classification Search
USPC ..................................... 324/601, 750.01, 650
See application file for complete search history.

(56) References Cited

U.S. PATENT DOCUMENTS

| | | | |
|---|---|---|---|
| 5,262,716 A | 11/1993 | Gregory, Jr. et al. | |
| 6,643,597 B1 * | 11/2003 | Dunsmore | 702/104 |
| 8,205,499 B2 | 6/2012 | Gregg et al. | |
| 2006/0152232 A1 | 7/2006 | Shvets et al. | |
| 2012/0176906 A1 | 7/2012 | Hartenstein et al. | |
| 2013/0234741 A1 * | 9/2013 | Mow et al. | 324/750.01 |
| 2013/0257454 A1 * | 10/2013 | Mow et al. | 324/619 |

OTHER PUBLICATIONS

Mow et al., U.S. Appl. No. 13/415,195, filed Mar. 8, 2012.
Agilent AN 1287-3 Applying Error Correction to Network Analyzer Measurements, Agilent Technologies, USA, 2002 (16 pages).
Agilent Network Analysis Applying the 8510 TRL Calibration for Non-Coaxial Measurements: Product Note 8510-8A, Agilent Technologies, USA, 2000 (24 pages).

* cited by examiner

*Primary Examiner* — Vincent Q Nguyen
(74) *Attorney, Agent, or Firm* — Treyz Law Group; Jason Tsai; Michael H. Lyons

(57) ABSTRACT

A test system for characterizing an antenna tuning element is provided. The test system may include a test host, a radio-frequency tester, and a test fixture. The test system may calibrate the radio-frequency tester using known coaxial standards. The test system may then calibrate transmission line effects associated with the test fixture using a THRU-REFLECT-LINE calibration algorithm. The antenna tuning element may be mounted on a test socket that is part of the test fixture. While the antenna tuning element is mounted on the test socket, scattering parameter measurements may be obtained using the radio-frequency tester. An equivalent circuit model for the test socket can be obtained based on the measured scattering parameters and known characteristics of the antenna tuning element. Once the test socket has been characterized, an equivalent circuit model for the antenna tuning element can be obtained by extracting suitable modeling parameters from the measured scattering parameters.

6 Claims, 14 Drawing Sheets

METHODS FOR MODELING TUNABLE RADIO-FREQUENCY ELEMENTS

BACKGROUND

This relates generally to wireless communications circuitry, and more particularly, to electronic devices having wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too narrow, the antenna will not be able to cover all communications bands of interest.

In view of these considerations, it would be desirable to provide antenna tuning elements that allow the antenna to cover a wider range of frequency bands. Moreover, it may be desirable to provide ways for characterizing the performance of such types of tuning elements.

SUMMARY

A wireless electronic device may include storage and processing circuitry and wireless communications circuitry. The wireless communications circuitry may include a baseband processor, transceiver circuitry, and at least one antenna. The antenna may include an antenna resonating element and at least one antenna tuning element. The antenna tuning element may be used to help the antenna cover a wider range of communications frequencies than would otherwise be possible.

The tunable element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the antenna at selected frequencies.

In accordance with an embodiment of the present invention, a test system may be provided that includes a test host (e.g., a personal computer), a radio-frequency tester (e.g., a vector network analyzer), a power supply unit, a test fixture, cabling (e.g., coaxial cables) for coupling the radio-frequency tester to the test fixture, and other test equipment. The antenna tuning element currently being tested using the test system may be referred to as a device under test (DUT), a device component under test, or a circuit under test (CUT). The power supply unit may serve to supply power to the DUT during testing. The test host may send control signals to the DUT that places the DUT in a desired one of multiple possible operating states. The test fixture may include a test board on which transmission lines are formed and may also include a test socket configured to receive the DUT.

During test operations, known coaxial standards may be used to calibrate the radio-frequency tester and the associated coaxial cables. The test board may then be calibrated using a THRU-REFLECT-LINE (TRL) method to remove systematic effects associated with the transmission lines formed on the test board. While the DUT is received within the test socket, the radio-frequency tester may be used to obtain scattering parameter measurements from the DUT (e.g., two-port reflection coefficient measurements such as S11 and S22 and two-port transfer/transmission coefficient measurements such as S21 and S12 may be gathered using the radio-frequency tester).

Computer-aided-design (CAD) tools running on the test host may then be used to obtain an equivalent circuit model for the test socket based on known characteristics of the DUT. The CAD tools may then be used to compute an equivalent circuit model for each operating state of the DUT. The equivalent circuit models may include modeling components such as resistors, capacitors, inductors, and/or other passive components coupled in desired series-parallel configuration. The values of these modeling component may be extracted based the on measured scattering parameters (e.g., by converting the scattering parameter to other two-port parameters and using the converted parameters as inputs to predetermined equations, wherein the predetermined equations output optimized parametric values for each modeling component).

Further features of the present invention, its nature and various advantages will be more apparent from the accompanying drawings and the following detailed description.

DETAILED DESCRIPTION

Figure 1:
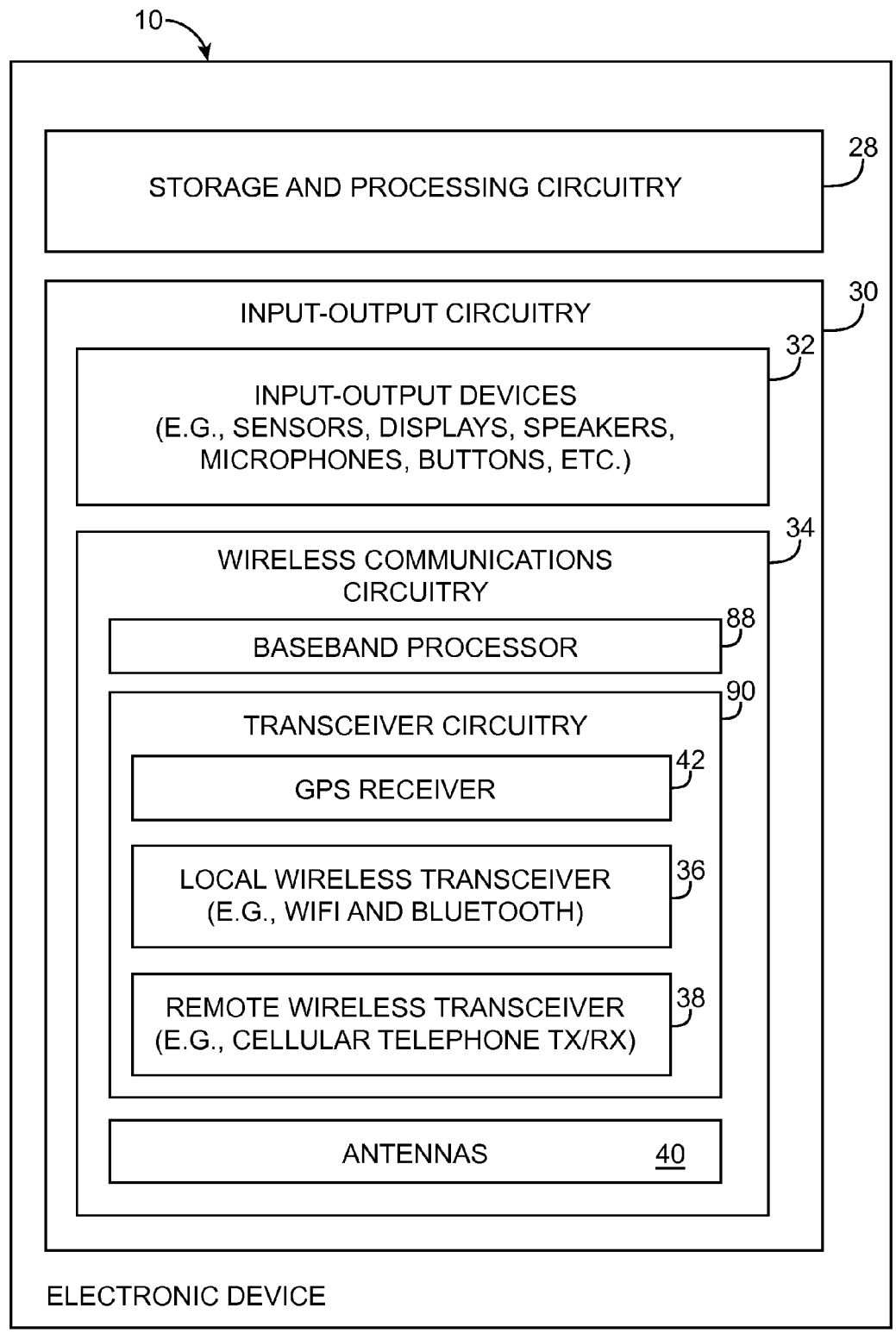
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
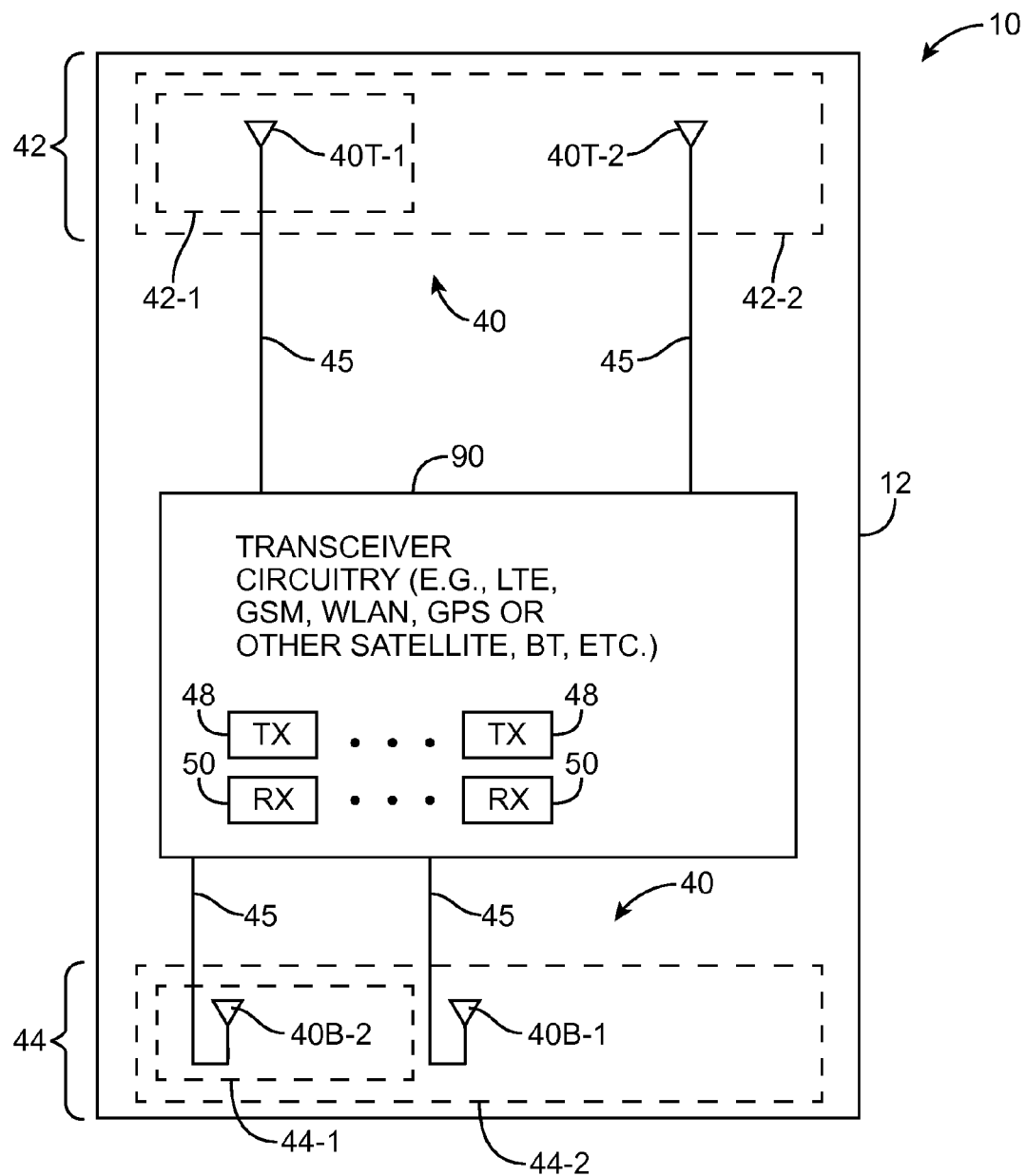
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
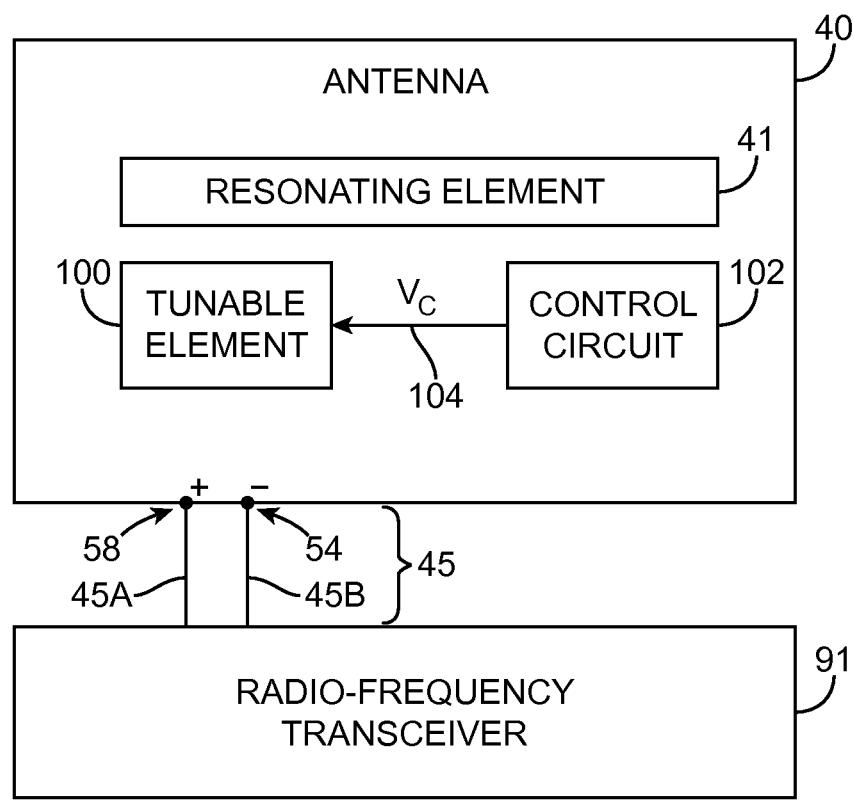
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may include receivers and/or transmitters in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

As shown in FIG. 3, antenna 40 may include a resonating element 41 and antenna tuning circuitry. Resonating element 41 may be formed from a loop antenna structure, patch antenna structure, inverted-F antenna structure, slot antenna structures, planar inverted-F antenna structures, helical antenna structures, hybrids of these designs, etc. The use of antenna tuning circuitry may help device 10 cover a wider range of communications frequencies than would otherwise be possible.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 may be provided with antenna tuning circuitry. The antenna tuning circuitry may include a radio-frequency tunable component such as tunable component (sometimes referred to as an adjustable antenna tuning element) 100 and an associated control circuitry such as control circuit 102 (see, e.g., FIG. 3). Tunable element 100 and/or control circuit 102 may sometimes be formed as an integral part of antenna resonating element 41 or as a separate discrete surface-mount component that is attached to antenna resonating element 41.

For example, antenna tuning element 100 may include switching circuitry based on one or more switches or continuously tunable load components. Control circuit 102 may be used to place tunable element 100 in the desired state by sending appropriate control signals Vc via path 104. The switching circuitry may, for example, include a switch that can be placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired.

Figure 4A:
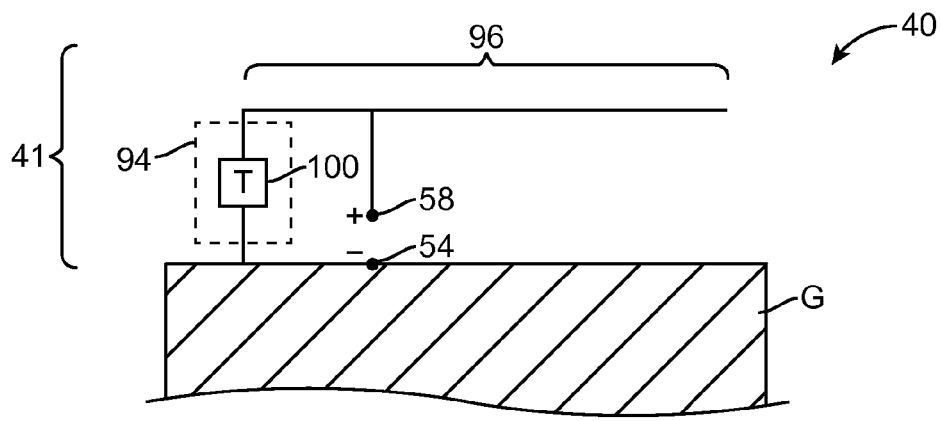
FIGS. 4A, 4B, and 4C are schematic diagrams of an illustrative inverted-F antenna containing antenna tuning elements in accordance with an embodiment of the present invention.

In one suitable embodiment of the present invention, antenna 40 may be an inverted-F antenna. FIG. 4A is a schematic diagram of an inverted-F antenna that may be used in device 10. As shown in FIG. 4A, inverted-F antenna 40 may have an antenna resonating element such as antenna resonating element 41 and a ground structure such as ground G. Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 4A example is shown as being a single straight segment. This is merely illustrative. Arm 96 may have multiple bends with curved and/or straight segments, if desired.

In the example of FIG. 4A, inverted-F antenna 40 may include an antenna tuning element 100 interposed in shorting path 94. Antenna tuning element 100 may, for example, be a switchable impedance matching network, a switchable inductive network, a continuously tunable capacitive circuit, etc.

Figure 4B:
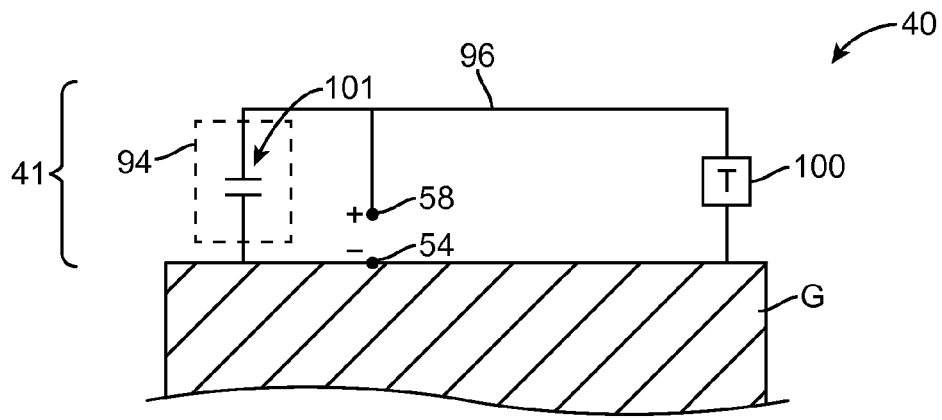

In another suitable arrangement of the present invention, resonating element 41 of inverted-F antenna 40 may include an antenna tuning element 100 coupled between the extended portion of resonating arm 96 and ground G (see, e.g., FIG. 4B). In such an arrangement, a capacitive structure such as capacitor 101 may be interposed in shorting path 94 so that antenna tuning circuit 100 is not shorted to ground at low frequencies. In the example of FIG. 4B, antenna tuning element 100 may be a switchable inductor, a continuously tunable capacitive/resistive circuit, etc.

Figure 4C:
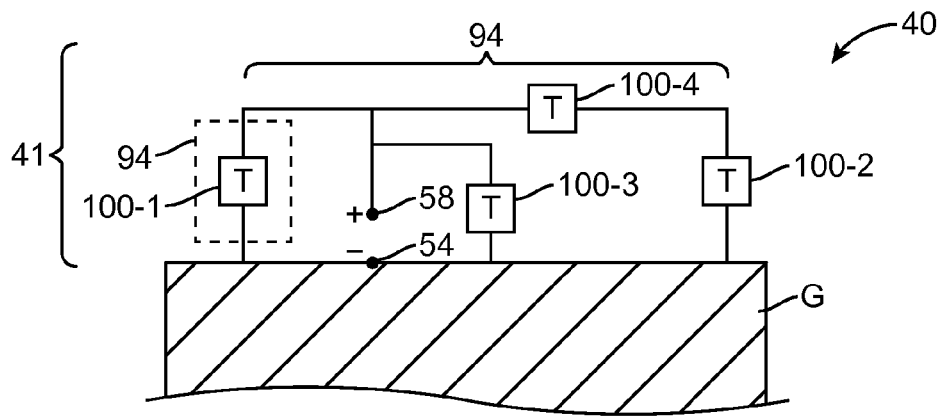

In general, antenna 40 may include any number of antenna tuning elements 100. As shown in FIG. 4C, short circuit branch 94 may include at least one tunable element 100-1 that couples arm 96 to ground. Tunable element 100-1 may be a switchable inductive path, as an example (e.g., element 100-1 may be activated to short arm 96 to ground). If desired, antenna tuning element 100-3 may be coupled in parallel with the antenna feed between positive antenna feed terminal 58 and ground feed terminal 54. Tunable element 100-3 may be an adjustable impedance matching network circuit, as an example.

As another example, antenna tuning element 100-4 may be interposed in antenna resonating arm 96. Antenna tuning element 100-4 may be a continuously adjustable variable capacitor (as an example). If desired, additional tuning elements such tuning element 100-2 (e.g., continuously tunable or semi-continuously tunable capacitors, switchable inductors, etc.) may be coupled between the extended portion of arm 96 to ground G.

The placement of these tuning circuits 100 in FIGS. 4A, 4B, and 4C is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 in device 10 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning element 100 (formed at any suitable location on the antenna) that can be adjusted so that wireless circuitry 34 may be able to cover the desired range of communications frequencies.

Figure 5A:
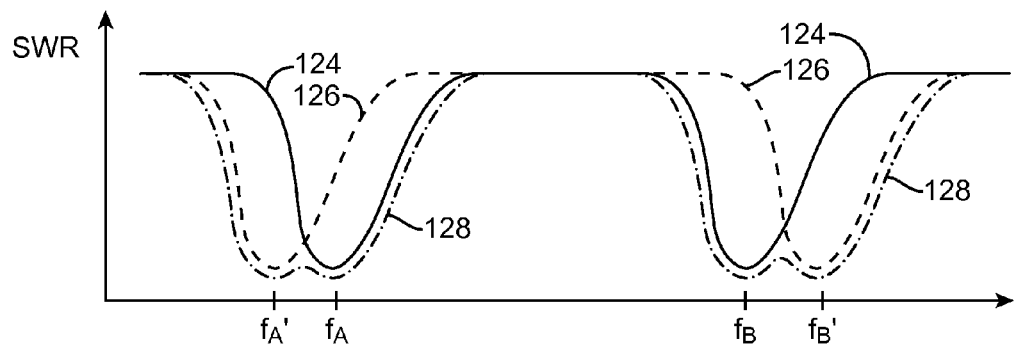
FIGS. 5A and 5B are plots showing how antennas containing tuning elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 5A illustrates the band tuning capability for antenna 40. As shown in FIG. 5A, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals that is different than the first and second sets of control signals). A combination of tuning methods may be used so that the resonance curve 128 exhibits broader frequency ranges than curves 124 and 126.

Figure 5B:
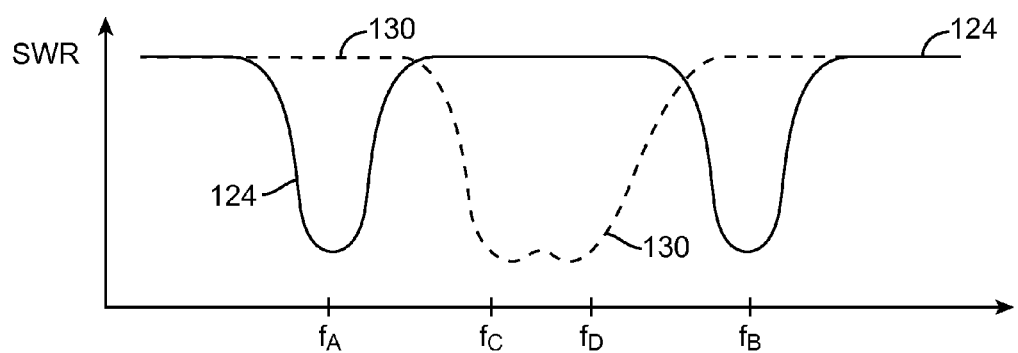

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 5B. In the fourth antenna tuning mode, the antenna tuning circuits 100 may yet be placed in another different configuration. The SWR curves of FIGS. 5A and 5B are merely illustrative and do not serve to limit the scope of the present invention. In general, antenna(s) 40 may include antenna tuning circuits 100 that enable device 10 to transmit and receive wireless signals in any suitable number of radio-frequency communications bands.

Figure 6A:
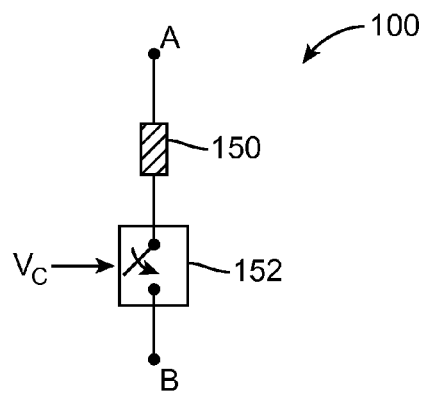
FIGS. 6A and 6B are circuit diagrams of illustrative switchable load circuits that may be used as antenna tuning elements in accordance with an embodiment of the present invention.

Antenna tuning element 100 may be any switchable or tunable electrical component that can be adjusted in real time. Antenna tuning element 100 may have a first terminal A and a second terminal B that may be coupled to desired locations on antenna resonating element 41 and a third terminal operable to receive control signal Vc from control circuit 102. FIG. 6A shows one suitable circuit implementation of tunable element 100. As shown in FIG. 6A, element 100 may include a radio-frequency switch 150 and a load circuit 152 coupled in series between terminals A and B. Switch 152 may be implemented using a p-i-n diode, a gallium arsenide field-effect transistor (FET), a microelectromechanical systems (MEMs) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 102 (see, e.g., FIG. 3). For example, a high Vc will turn on or close switch 402 whereas a low Vc will turn off or open switch 402.

Load circuit 152 may be formed from one or more electrical components. Components that may be used as all or part of circuit 152 include resistors, inductors, and capacitors. Desired resistances, inductances, and capacitances for circuit 152 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 6B:
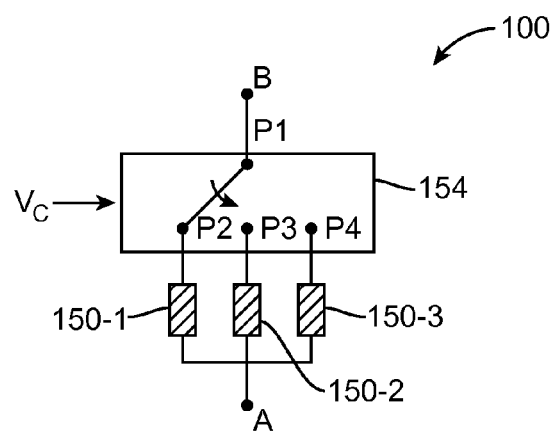

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described previously, load circuits 150-1, 150-2, and 150-3 may include any desired combination of resistive components, inductive components, and capacitive components formed using integrated circuits, discrete components, or other suitable conductive structures. Switch 154 may be controlled using signal Vc generated by control circuit 102. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 includes three impedance loading circuits is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 may be coupled to port P1 in parallel.

Figure 6C:
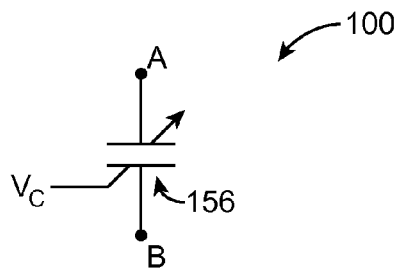
FIG. 6C is a circuit diagram of an illustrative variable capacitor circuit that may be used as an antenna tuning element in accordance with an embodiment of the present invention.

In another suitable arrangement, tunable element 100 may include a variable capacitor circuit 156 (sometimes referred to as a varactor). As shown in FIG. 6C, varactor may have first terminal A, second terminal B, and a control terminal operable to receive signal Vc from control circuit 300. Control circuit 102 may be adjusted so that Vc adjusts the capacitance of varactor 156 to the desired amount. Varactor 156 may be formed using integrated circuits, one or more discrete components (e.g., SMT components), etc. In general, varactor 156 may be continuously variable capacitors or semi-continuously adjustable capacitors.

Having antenna tuning element 100 as part of antenna 40 introduces an additional component that needs to be characterized, because the design of antenna tuning element 100 can substantially impact the antenna performance of device 10. For example, the position at which element 100 is placed relative to the antenna feed terminals, the materials with which element 100 is constructed, the orientation of element 100 within device 10, and other design factors associated with element 100 can affect the wireless operation of device 10. It may therefore be desirable to have a way of characterizing the performance of antenna tuning element 100 to provide guidance in the antenna design of device 10.

Figure 7:
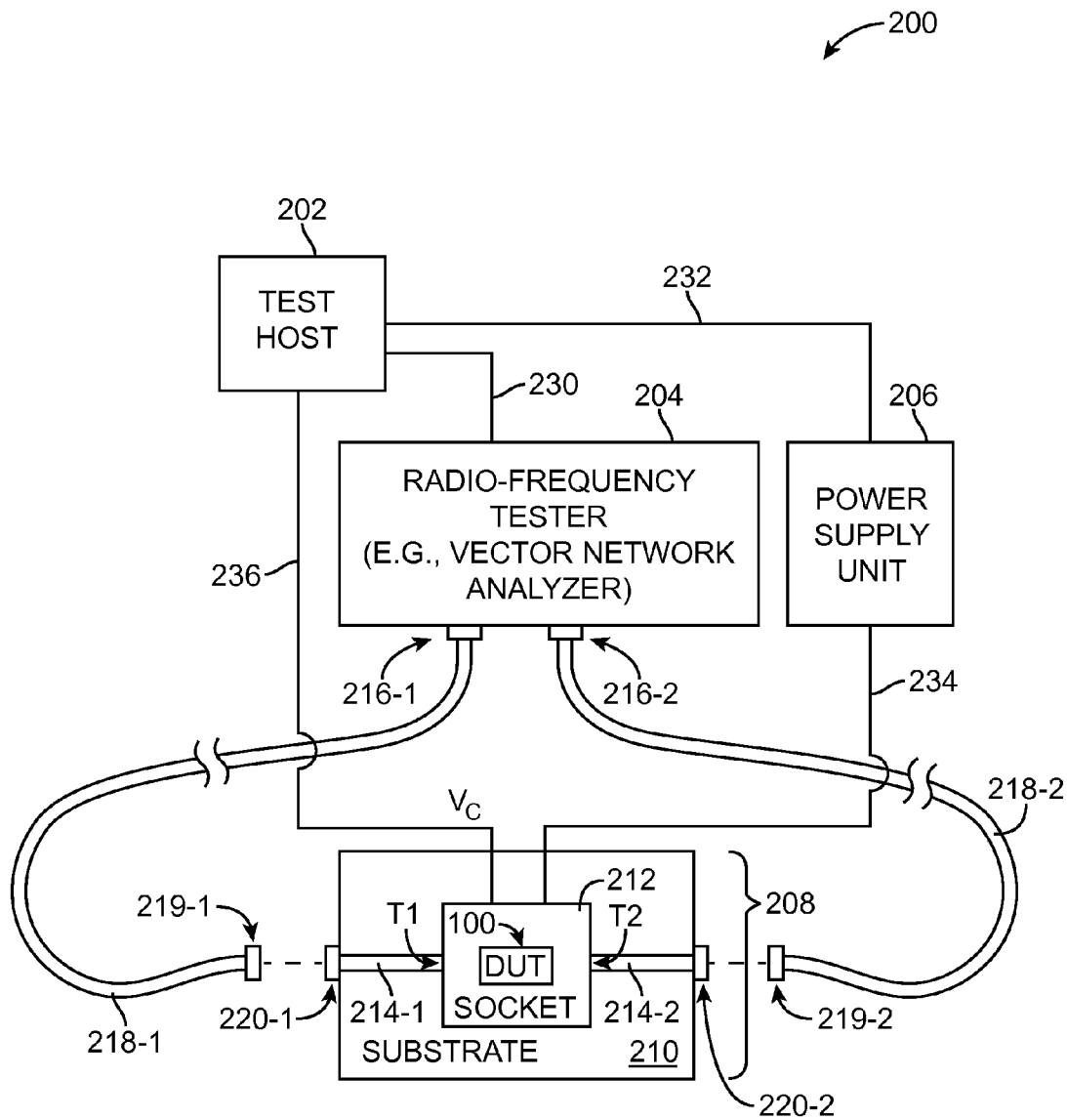
FIG. 7 is a diagram of an illustrative test system for characterizing an antenna tuning element in accordance with an embodiment of the present invention.

In accordance with an embodiment of the present invention, antenna tuning element 100 may be characterized using a test system such as test system 200 of FIG. 7. An antenna tuning element 100 that is being characterized using test system 200 may sometimes be referred to as a device under test (DUT). As shown in FIG. 7, test system 200 may include a test host such as test host 202 (e.g., a personal computer), a radio-frequency tester such as radio-frequency tester 204, a power supply unit such as power supply unit 206, a test fixture such as test fixture 208, control circuitry, network circuitry, cabling, and other test equipment.

DUT 100 may be attached to test fixture 208 during testing. Test fixture 208 may include a substrate 210 and a test socket 212 that is mounted on substrate 210. Substrate 210 may be a plastic support structure or other dielectric structure, a rigid printed circuit board substrate such as a fiberglass-filled epoxy substrate (e.g., FR4), a flexible printed circuit ("flex circuit") formed from a sheet of polyimide or other flexible polymer, or other substrate material. Test socket 212 may be a test structure having a recess that is configured to receive DUT 100 and may include pins (e.g., pogo pins), springs, conductive pads, solder balls, or other coupling mechanisms within its recess that can be used to make an electrical connection with corresponding contact terminals on DUT 100.

Substrate 210 may have a first edge portion to which a first radio-frequency connector 220-1 is attached and a second edge portion to which a second radio-frequency connector 220-2 is attached. First radio-frequency connector 220-1 may be coupled to a first terminal T1 of test socket 212 via conductive trace 214-1, whereas second radio-frequency connector 220-2 may be coupled to a second terminal T2 of test socket 212 via conductive trace 214-2.

Conductive traces 214-1 and 214-2 may be formed on a top surface of substrate 210 (i.e., an upper surface of substrate 210 on which socket 210 is mounted). An associated ground plane may be formed in substrate 210 under the top surface for providing a ground reference for signals propagating through the conductive traces. Conductive traces 214-1 and 214-2 and the associated ground plane formed as a part of substrate 210 in this way may collectively serve as a microstrip transmission line path through which radio-frequency test signals may be conveyed during testing. In general, substrate 210 may be configured to form any suitable transmission line path such as stripline transmission lines, edge coupled microstrip transmission lines, edge coupled stripline transmission lines, or other suitable transmission line structures through which radio-frequency signals may be conveyed.

Radio-frequency tester 204 may be a vector network analyzer (as an example). Tester 204 may have a first port 216-1 to which a first radio-frequency cable 218-1 is connected and a second port 216-2 to which a second radio-frequency cable 218-2 is connected. Radio-frequency cables 218-1 and 218-2 may, for example, be coaxial cables. In particular, first cable 218-1 may have a first end that is connected to tester port 216-1 and a second end terminating at a first radio-frequency connector 219-1. Similarly, second cable 218-2 may have a first end that is connected to tester port 216-2 and a second end terminating at a second radio-frequency connector 219-2. First port 216-1 of tester 204 may be coupled to conductive trace 214-1 (e.g., by mating RF connectors 219-1 and 220-1), whereas second port 216-2 of tester 204 may be coupled to conductive trace 214-2 (e.g., by mating RF connectors 219-2 and 220-2). Radio-frequency tester 204 may receive commands from test host 202 via path 230 that direct tester 204 to gather desired radio-frequency measurement. If desired, test data can be provided from tester 204 to test host 202 via path 230.

During testing, DUT 100 may be mated with test socket 210 (e.g., DUT 100 may be inserted into a recess within test socket 210). When DUT 100 is mated with socket 210, terminal A of DUT 100 may be coupled to terminal T1 of socket 210 (e.g., so that terminal A of DUT 100 is electrically connected to port 216-1 of tester 204 via trace 214-1 and cable 218-1), whereas terminal B of DUT 100 may be coupled to terminal T2 of socket 210 (e.g., so that terminal B of DUT 100 is electrically connected to port 216-2 of tester 204 via trace 214-2 and cable 218-2).

During testing, DUT 100 may receive control signals Vc from test host 202 via path 236. The control signals conveyed over path 236 may serve to place DUT 100 in the desired state for characterization. For example, consider a scenario in which DUT 100 is a varactor of the type shown in FIG. 6B. During a first test iteration, test host 202 may send control signals to DUT 100 via path 236 that configure switch 154 to connect ports P1 and P2. During a second test iteration, test host 202 may send control signals to DUT 100 via path 236 that configure switch 154 to connect ports P1 and P3. During a third test iteration, test host 202 may send control signals to DUT 100 via path 236 that configure switch 154 to connect ports P1 and P4. It is generally desirable to characterize DUT 100 in a variety of potential operating states using test system 200.

During testing, power supply unit 206 may serve to supply power to DUT 100 via path 234. In particular, power supply unit 206 can be used to monitor an amount of current that is drawn by DUT 100. Data reflective of the amount of current drawn by DUT 100 over time may be provided from power supply unit 206 to test host 202 via path 232. Monitoring current using power supply unit 206 in this way ensures that DUT 100 does not consume excessive amounts of power.

Radio-frequency tester 204 may be configured to produce radio-frequency test signals that are applied to DUT 100 via cables 218 and test fixture 208. Even without being connected to other components to form a completed antenna assembly, DUT 100 may emit radio-frequency signals when being energized by the test signals generated using tester 204. As electromagnetic test signals are transmitted by tester 204 and applied to DUT 100 through test cable 218-1, corresponding emitted electromagnetic test signals may be received through test cable 218-2 (as an example). Tester 204 may also receive reflected signals via cable 218-1 (i.e., signals that were reflected from DUT 100 in response to the signals transmitted through test cable 218-1).

The reflected signals gathered in this way may be used to compute a reflection coefficient (sometimes referred to as an S11 parameter or S11 scattering parameter). The transmitted signals on cable 218-1 and corresponding received signals on cable 218-2 may be used to compute a forward transfer coefficient (sometimes referred to as an S21 parameter or S21 scattering parameter). The S11 and S21 data may include magnitude and phase components.

Similarly, tester 204 may also transmit test signals to DUT 100 through test cable 218-2. As test electromagnetic signals are transmitted by tester 204 and applied to DUT 100 through test cable 218-2, corresponding emitted electromagnetic test signals may be received through test cable 218-1. Tester 204 may also receive reflected signals via cable 218-2 (i.e., signals that were reflected from DUT 100 in response to the signals transmitted through test cable 218-2). The emitted and reflected signals gathered in this way may be used to compute reflection coefficient data (sometimes referred to as an S22 scattering parameter) and forward transfer coefficient data (sometimes referred to as an S12 scattering parameter).

The S11, S12, S22, and S21 parameters (collectively referred to as scattering parameters or S parameters) measured using tester 204 may collectively be used as a baseline reference that is representative of radio-frequency characteristics associated with the device structures under test. As an example, consider a scenario in which test host 202 is being used to generate an equivalent circuit model for DUT 100 (e.g., using software such as computer-aided-design tools running on test host 202). Assuming that systematic errors associated with tester 204 and test fixture 208 (including errors associated with substrate 210 and socket 212) have been calibrated, parameter values for each electrical component in the equivalent circuit model may be extracted from the baseline reference measurements.

Test system 110 as shown in FIG. 7 is merely illustrative and does not serve to limit the scope of the present invention. If desired, test system 110 may include other means of controlling and monitoring the operation of DUT 100, may include other types of radio-frequency testers for measuring the performance of DUT 100, and may include any other suitable test equipment.

In an effort to optimize the antenna performance of device 10, it may be desirable to provide a way of accurately characterizing the performance of antenna tuning element 100 (often referred to herein as DUT 100). In one suitable arrangement, test system 200 of FIG. 7 may be used to obtain an equivalent circuit model that accurately models the behavior of DUT 100 across desired operating frequencies. Equivalent circuit models obtained using test system 200 may be used to simulate antenna performance under a variety of different user scenarios and may be helpful in understanding the interactions between antenna resonating element 41 and tunable element 100 during wireless operation of device 10.

Figure 8:
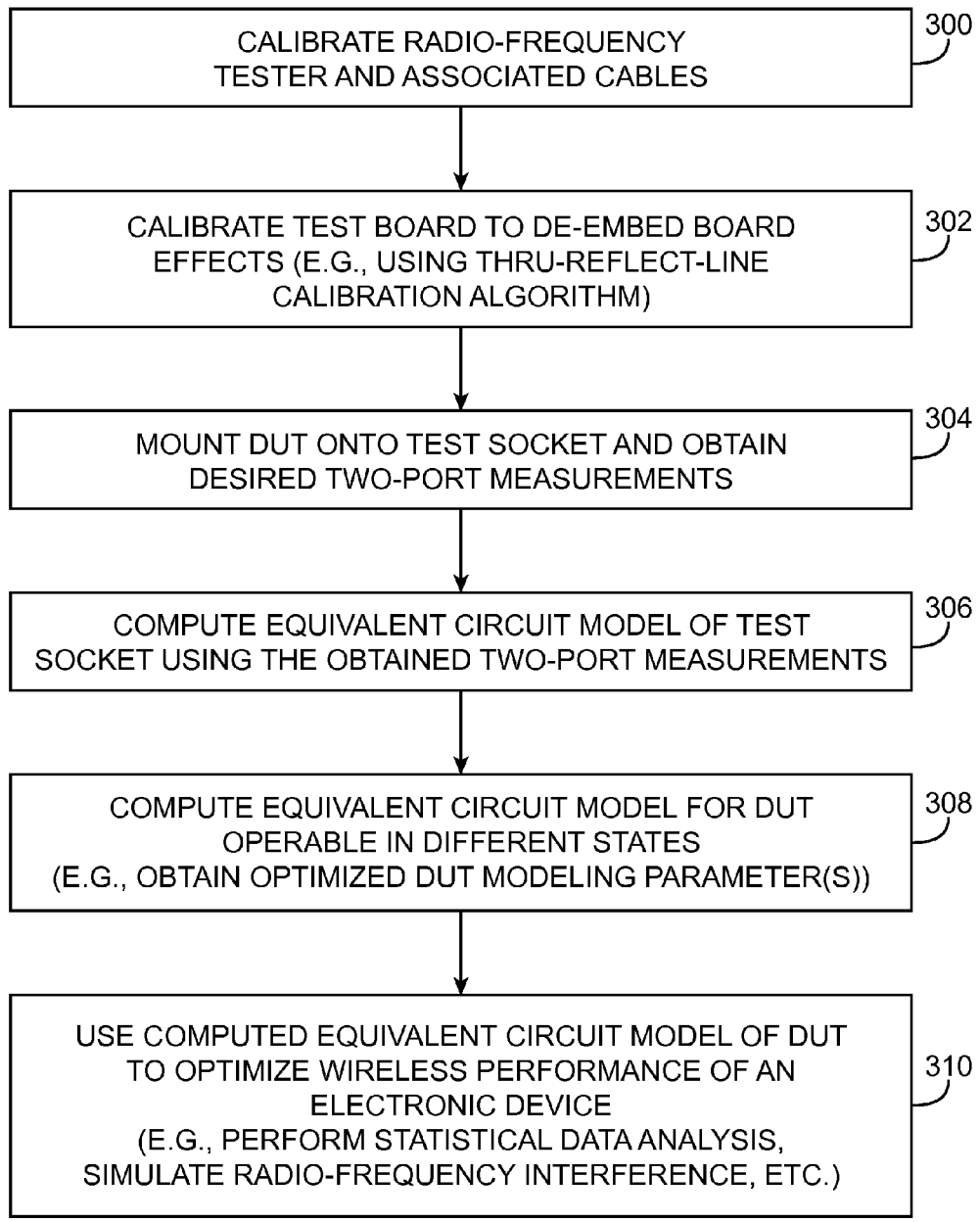
FIG. 8 is a flow chart of illustrative steps for obtaining an equivalent circuit model for an antenna tuning element in accordance with an embodiment of the present invention.

FIG. 8 is a flow chart of illustrative steps for obtaining an equivalent circuit model for DUT 100. In obtaining the equivalent circuit model for DUT 100, it may be desirable to separate the effects associated with the transmission medium (e.g., effects associated with test cables 218 and test fixture 208 in which DUT 100 is embedded during testing) from the DUT itself. At radio frequencies, systematic effects such as signal leakage and impedance mismatch can affect measured data. In a stable test environment, such types of systematic effects are repeatable and can be characterized and removed via calibration. As an example, reference test structures (sometimes referred to as test standards) can sometimes be connected to tester 204 during calibration. Systematic effects may then be quantified by computing the difference between measured and known responses associated with the reference test structures. This process of removing systematic effects associated with the test equipment is sometimes referred to as error correction.

Figure 9:
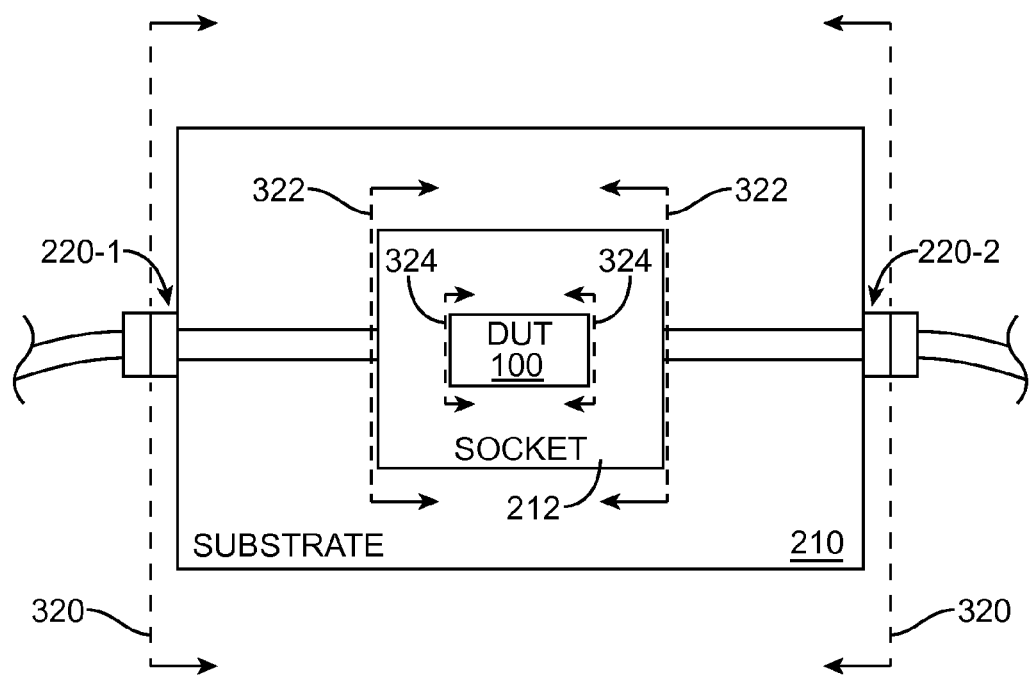
FIG. 9 is a diagram showing how test reference planes may be shifted using the steps of FIG. 8 in accordance with an embodiment of the present invention.

At step 300, radio-frequency tester 204 may be calibrated to remove potential errors that are associated with radio-frequency tester 204 and coaxial cables 218 (i.e., cables 218-1 and 218-2). For example, vector network analyzer 204 may be calibrated at the coaxial ports using known coaxial standards (e.g., using conventional open, short, load and thru coaxial standards) to ensure that vector network analyzer 204 is initialized to desired test settings. Once this step is complete, measurements gathered using tester 204 will only reflect the behavior of structures coupled to the ends of coaxial cables 218 (e.g., ports 216-1 and 216-2 of tester 204 are virtually extended to the ends of cables 218 so that a new test reference plane 320 is established, as shown in FIG. 9).

At step 302, test board 210 may be calibrated to de-embed systematic effects that are associated with the transmission lines on test board 210. In one suitable arrangement, test board 210 may be calibrated using a THRU-REFLECT-LINE (TRL) approach. The TRL approach is a two-port calibration procedure that relies on testing different transmission line structures on a substrate to fully characterize systematic errors associated with the substrate.

Figure 10:
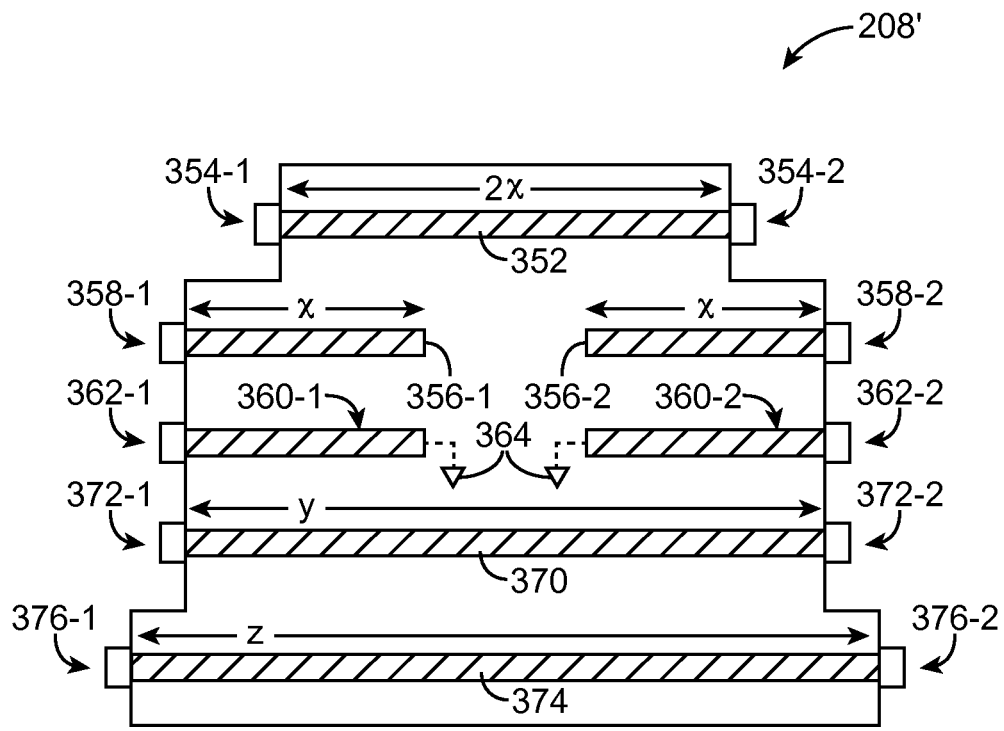
FIG. 10 is a diagram of an illustrative reference test fixture that can be used when performing THRU-REFLECT-LINE calibration in accordance with an embodiment of the present invention.

For example, a reference test fixture such as reference fixture 208' having different types of transmission line structures may be connected to radio-frequency tester 204 during step 302 (see, e.g., FIG. 10). Test board 210 and the substrate of fixture 208' may have the same board thickness. Reference fixture 208' may also include conductive traces having the same widths as traces 214-1 and 214-2 that are formed on substrate 210. In general, using reference fixture 208' having physical dimensions similar to those of fixture 208 can help improve calibration accuracy.

As shown in FIG. 10, reference fixture 208' may include a conductive trace 352 that is coupled between RF connectors 354-1 and 354-2, conductive traces 356-1 and 356-2 having first ends coupled to RF connectors 358-1 and 358-2, respectively, and second ends that are open circuited, conductive traces 360-1 and 360-2 having first ends coupled to RF connectors 362-1 and 362-2, respectively, and second ends that are short circuited (to an associated ground plane 364 formed in a lower layer within substrate 208'), a conductive trace 370 that is coupled between RF connectors 372-1 and 372-2, and a conductive trace 374 that is coupled between RF connectors 376-1 and 376-2. Traces 356-1, 356-2, 360-1, and 360-2 may each have a length x, whereas trace 352 may have a length equal to 2x. Trace 370 may have a length y that is proportionally longer than the length of trace 352 so as to result in a 90° phase offset at a first operating frequency (e.g., in a high band operation associated with antenna 40). Trace 374 may have a length z that is proportionally longer than the length of trace 352 so as to result in a 90° phase offset at a second operating frequency (e.g., in a low band operation associated with antenna 40).

The TRL approach involves sequentially coupling tester 204 to each associated pair of RF connectors on reference fixture 208'. During the THRU calibration step, coaxial cables 218-1 and 218-2 may be respectively mated with connectors 354-1 and 354-2 while obtaining desired two-port measurements. During a first half of the REFLECT calibration step, coaxial cables 218-1 and 218-2 may be respectively mated with connectors 358-1 and 358-2 while obtaining a first set of reflection coefficient measurements associated with an open circuit response. During a second half of the REFLECT calibration step, coaxial cables 218-1 and 218-2 may be respectively mated with connectors 362-1 and 362-2 while obtaining a second set of reflection coefficient measurements associated with a short circuit response. During a first half of the LINE calibration step, coaxial cables 218-1 and 218-2 may be respectively mated with connectors 372-1 and 372-2 while obtaining a first set of two-port measurements associated with the high band operation. During a second half of the LINE calibration step, coaxial cables 218-1 and 218-2 may be respectively mated with connectors 376-1 and 376-2 while obtaining a second set of two-port measurements associated with the low band operation.

Measurements gathered from reference fixture 208' using this approach can then be applied to tester 204 to remove any effects associated with test board 210 (e.g., to take into account systematic errors associated with the interface between the coaxial ports and the conductive traces). Once the TRL calibration is complete, measurements gathered using tester 204 will only reflect the behavior of structures coupled to the ends of conductive traces 214-1 and 214-2 (e.g., ports 216-1 and 216-2 of tester 204 will be virtually extended to the edge of test socket 212, shifting the test reference plane to position 322 as shown in FIG. 9). If desired, any suitable variation of the TRL approach can be used during step 302.

At step 304, tester 204 may be connected to test fixture 208, and DUT 100 may be attached to test socket 212. While DUT 100 is secured within test socket 212, tester 204 may be used to gather desired two-port measurements from DUT 100 (e.g., tester 204 may be configured to obtain desired S parameter measurements from DUT 100). These measurements may serve as baseline measurement data from which equivalent circuit models for test socket 212 and DUT 100 may be obtained. At step 306, test host 202 may be used to generate an equivalent circuit model for test socket 212 based on known frequency response characteristics associated with DUT 100 and the two-port measurements obtain during step 304 (i.e., based on the baseline measurement data).

Figure 11:
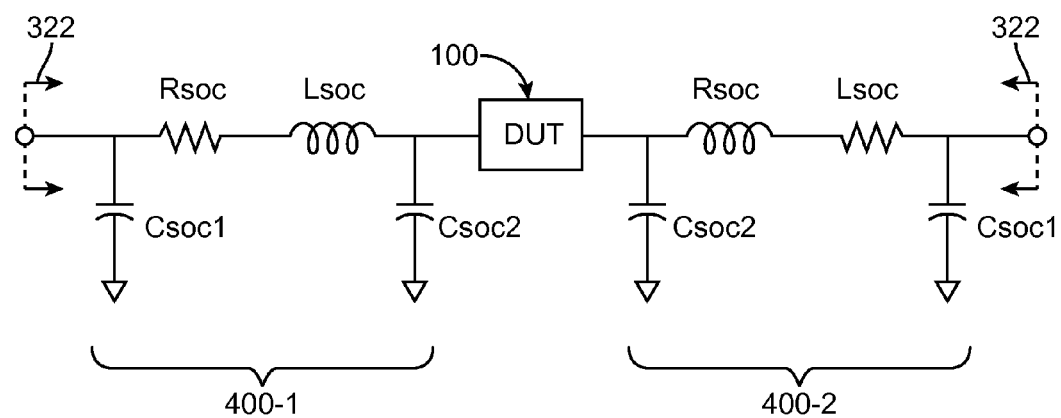
FIG. 11 is a schematic diagram illustrating an equivalent circuit model of a test socket in accordance with an embodiment of the present invention.

An exemplary equivalent circuit model for test socket 212 is shown in FIG. 11. As shown in FIG. 11, the equivalent circuit model for test socket 212 may include a first group of modeling components 400-1 associated with terminal T1 of socket 212 and a second group of modeling components 400-2 associated with terminal T2 of socket 212. Each of groups 400-1 and 400-2 may include a resistor Rsoc and an inductor Lsoc coupled in series and capacitors Csoc1 and Csoc2 shunted to ground. Based on known radio-frequency response characteristics of DUT 100, the parametric values of Rsoc, Lsoc, Csoc1, and Csoc2 may be extracted from the baseline measurement data and may be further optimized via simulation so that each of the parametric values remain relatively constant across desired operating frequencies. The example of FIG. 11 in which the equivalent circuit model for socket 212 is based on a pi ($\pi$) network configuration is merely illustrate and does not serve to limit the scope of the present invention. If desired, the equivalent circuit model of test socket 212 may be based on a T network configuration or may include any suitable number of modeling components coupled in any desired series-parallel configuration.

Once the equivalent circuit model of socket 212 is obtained and applied to tester 204 (to remove systematic effects associated with test socket 212), any subsequent measurement using tester 204 will only reflect the behavior of DUT 100 (e.g., ports 216-1 and 216-2 of tester 204 will be virtually extended to the edge of DUT 100, shifting the test reference plane to position 324 as shown in FIG. 9). At this point, all errors associated with the test equipment have been calibrated for.

Figure 12A:
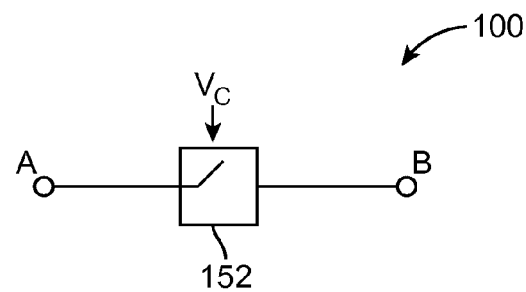
FIG. 12A is a diagram of an illustrative single-pole single-throw radio-frequency switch coupled in a series configuration in accordance with an embodiment of the present invention.
Figure 12B:
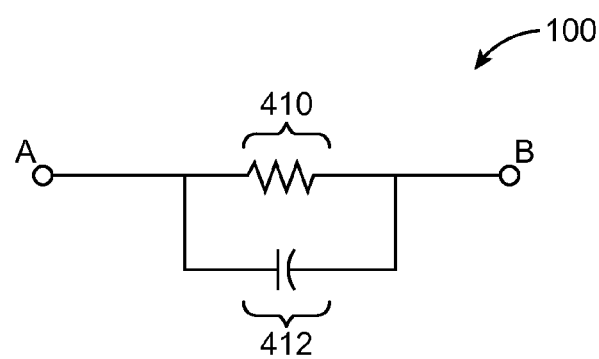
FIG. 12B is a diagram of an equivalent circuit model for the radio-frequency switch of FIG. 12A in an off state in accordance with an embodiment of the present invention.

At step 308, test host 202 may be used to compute an equivalent circuit model for DUT 100 (e.g., to obtain an equivalent circuit model for accurately representing the known frequency response characteristics of DUT 100 while taking into account the systematic effects of test fixture 208 and the measured scattering parameters). If DUT 100 is operable in more than one state, a respective equivalent circuit model may be computed for each of the operating states of DUT 100. As an example, consider a scenario in which DUT 100 includes a single-pole single-throw (SPST) switch 152 arranged in a series configuration (see, e.g., FIG. 12A). In this example, switch 152 may have one end serving as port A for DUT 100 and another end serving as port B for DUT 100. FIG. 12B is a diagram of an illustrative equivalent circuit model of DUT 100 when switch 152 is placed in the off state (e.g., when Vc is deasserted to open switch 152).

As shown in FIG. 12B, the equivalent circuit model for DUT 100 in the off state may include a modeling resistor 410 and a modeling capacitor 412 coupled in parallel between terminals A and B. Resistor 410 may, for example, have a conductance $G_1$ that is calculated using the following equation:

$$G_1 = \text{real}(Y_{12}) \quad (1)$$

As shown in equation (1), $G_1$ may be calculated as a function of $Y_{12}$. Parameter $Y_{12}$ represents a transfer admittance associated with an admittance matrix Y that can be extracted from the measured S parameters (i.e., from the measurement data obtained at step 304). For example, Y parameters can be converted from the measured S parameters using the following equations:

$$Y_{11} = \frac{((1-S_{11})(1+S_{22}) + S_{12}S_{21})}{\Delta s} Y_0 \quad (2)$$

$$Y_{12} = \frac{-2S_{12}}{\Delta s} Y_0 \quad (3)$$

$$Y_{21} = \frac{-2S_{21}}{\Delta s} Y_0 \quad (4)$$

$$Y_{22} = \frac{((1+S_{11})(1-S_{22}) + S_{12}S_{21})}{\Delta s} Y_0 \quad (5)$$

where $$\Delta s = (1+S_{11})(1+S_{22}) - S_{12}S_{21}$$

and where $Y_0$ is equal to the characteristic admittance of ports A and B (assuming the admittance for both ports are equal). Capacitor 412 may have a capacitance that can also be extracted from the measured S parameters. Capacitor 412 may, for example, have a capacitance $C_1$ that is calculated using the following equation:

$$C_1 = \text{imag}(Y_{12})/\omega \quad (6)$$

Ideally, the values of $G_1$ and $C_1$ extracted in this way remain relatively constant across the desired operating frequencies for DUT 100. Equations 1-6 are merely illustrative. Other suitable ways for obtaining values of $G_1$ and $C_1$ (e.g., computations based on hybrid (H) parameter values, inverse-hybrid (G) parameter values, cascaded (ABCD) parameter values, scattering transfer (T) parameter values, and other two-port network parameters) may be employed.

Figure 12C:
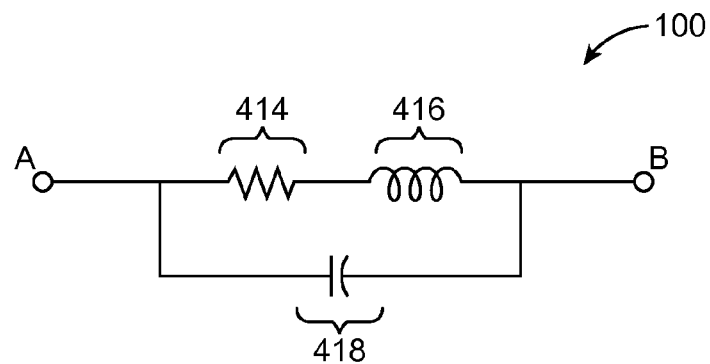
FIG. 12C is a diagram of an equivalent circuit model for the radio-frequency switch of FIG. 12A in an on state in accordance with an embodiment of the present invention.

FIG. 12C is a diagram of an illustrative equivalent circuit model of DUT 100 when switch 152 is placed in the on state (e.g., when Vc is asserted to close switch 152). As shown in FIG. 12C, the equivalent circuit model for DUT 100 in the on state may include a modeling capacitor 418 coupled between ports A and B and may also include a modeling resistor 414 and a modeling inductor 416 coupled in series between ports A and B. Modeling capacitor 418 may have a predetermined (known) capacitance C* that is related to DUT 100 and/or the physical properties of test fixture 208. Modeling resistor 414 may have a resistance value $R_1$, whereas inductor 416 may have an inductance value $L_1$. Values $R_1$ and $L_1$ can be respectively calculated using the following equations:

$$R_1 = \text{real}(Y_{11} - j\omega C^*) \qquad (7)$$

$$L_1 = \text{imag}(Y_{11} - j\omega C^*)/\omega \qquad (8)$$

Ideally, the values of $R_1$ and $L_1$ computed in this way remain relatively constant across the desired operating frequencies for DUT 100. Equations 7 and 8 are merely illustrative. Other suitable ways for obtaining values of $R_1$ and $L_1$ (e.g., computations based on hybrid (H) parameter values, inverse-hybrid (G) parameter values, cascaded (ABCD) parameter values, scattering transfer (T) parameter values, and other two-port network parameters) may be employed.

Figure 13A:
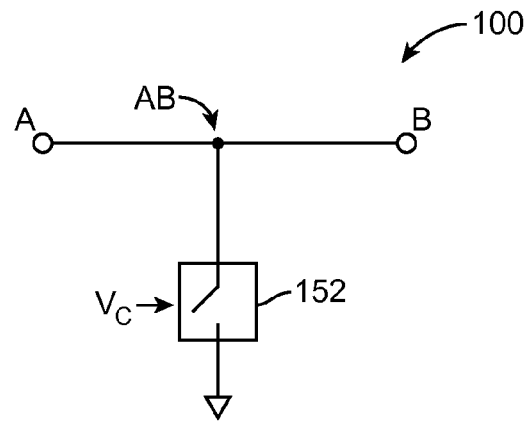
FIG. 13A is a diagram of an illustrative single-pole single-throw radio-frequency switch coupled in a shunt configuration in accordance with an embodiment of the present invention.
Figure 13B:
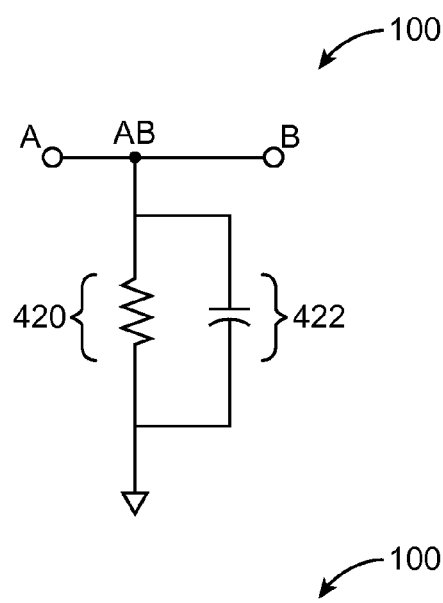
FIG. 13B is a diagram of an equivalent circuit model for the radio-frequency switch of FIG. 13A in an off state in accordance with an embodiment of the present invention.

Consider another scenario in which DUT 100 includes an SPST switch 152 arranged in a shunt configuration (see, e.g., FIG. 13A). In this example, switch 152 may have a first end that is coupled to both port A and port B of DUT 100 and a second end that is shorted to ground. The first end of switch 152 may be referred to herein as being coupled to node AB. FIG. 13B is a diagram of an illustrative equivalent circuit model of DUT 100 when switch 152 is placed in the off state (e.g., when Vc is deasserted to open switch 152).

As shown in FIG. 13B, the equivalent circuit model for DUT 100 in the off state may include a modeling resistor 420 and a modeling capacitor 422 coupled in parallel between node AB and ground. Modeling resistor 420 may have a conductance value $G_2$, whereas modeling capacitor 422 may have a capacitance value $C_2$. Values $G_2$ and $C_2$ may be respectively calculated using the following equations:

$$G_2 = \text{real}(1/Z_{12}) \qquad (9)$$

$$C_2 = \text{imag}(1/Z_{12})/\omega \qquad (10)$$

As shown in equations (9) and (10), $G_2$ and $C_2$ may be calculated as a function of $Z_{12}$. Parameter $Z_{12}$ represents an element associated with an impedance matrix Z that can be extracted from the measured S parameters. For example, $Z_{22}$ can be converted from the extracted Y parameters (i.e., parameters as computed using equations (2)-(5)) using the following equation:

$$Z_{12} = \frac{-Y_{12}}{\Delta y} \qquad (11)$$

where $$\Delta y = Y_{11}Y_{22} - Y_{12}Y_{21}$$

The term $\Delta y$ is sometimes referred to as the determinant of the Y parameter matrix. Ideally, the values of $G_2$ and $C_2$ extracted using this approach stays relatively constant across the desired operating frequencies for DUT 100.

Figure 13C:
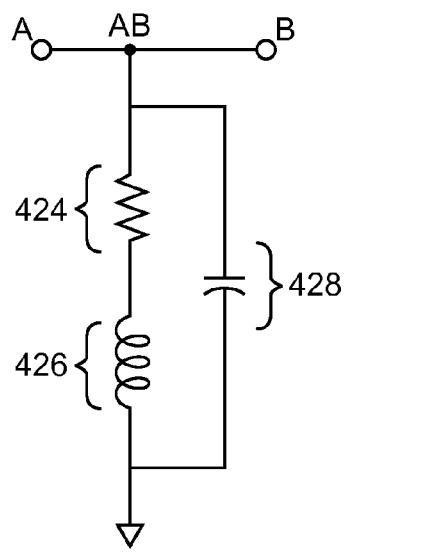
FIG. 13C is a diagram of an equivalent circuit model for the radio-frequency switch of FIG. 13A in an on state in accordance with an embodiment of the present invention.

FIG. 13C is a diagram of an illustrative equivalent circuit model of DUT 100 when switch 152 is placed in the on state (e.g., when Vc is asserted to close switch 152). As shown in FIG. 13C, the equivalent circuit model for DUT 100 in the on state may include a modeling capacitor 428 coupled between node AB and ground and may also include a modeling resistor 424 and a modeling inductor 426 coupled in series between node AB and ground. Modeling capacitor 428 may have a predetermined (known) capacitance C* that is related to DUT 100 and/or the physical properties of test fixture 208 (e.g., the capacitance of modeling capacitor 428 may be equal to the capacitance of modeling capacitor 418 of FIG. 12C for the same radio-frequency switch). Modeling resistor 424 may have a resistance value $R_2$, whereas inductor 426 may have an inductance value $L_2$. Values $R_2$ and $L_2$ may be respectively calculated using the following equations:

$$R_2 = \text{real}(1/Z_{12} - j\omega C^*) \qquad (12)$$

$$L_2 = \text{imag}(1/Z_{12} - j\omega C^*)/\omega \qquad (13)$$

Ideally, the values of $R_2$ and $L_2$ extracted in this way stay relatively constant across the desired operating frequencies for DUT 100. Equations 9-13 are merely illustrative. Other suitable ways for obtaining values of $G_2$, $C_2$, $R_2$, and $L_2$ (e.g., computations based on H parameters, T parameters, or Z parameters) may be employed.

Figure 14A:
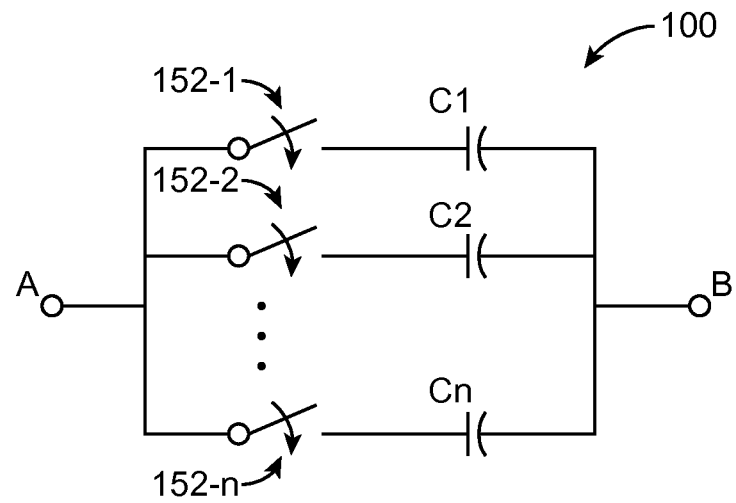
FIG. 14A is a circuit diagram of an illustrative capacitor array circuit that may be used as an antenna tuning element in accordance with an embodiment of the present invention.

In general, test system 200 of FIG. 7 may be used to generate an equivalent circuit model for any type of antenna tuning element 100 that includes more than one active and/or passive electronic components. For example, DUT 100 of FIG. 14A includes an array of capacitors C1-Cn operable to provide an adjustable total capacitance, where each of the multiple capacitors is serially connected to an associated radio-frequency single-pole single-throw switch 152 that can be turned on or off to switch the corresponding capacitor in or out of use. For example, switch 152-1 may be activated to couple capacitor C1 in parallel between ports A and B of DUT 100; switch 152-2 may be turned off to decoupled capacitor C2 (so that capacitor C2 does not contribute to the total capacitance of DUT 100); . . . , and switch 152-n may be turned on to switch capacitor Cn into use so that capacitor Cn is coupled in parallel between ports A and B and contributes to the total capacitance of DUT 100.

Figure 14B:
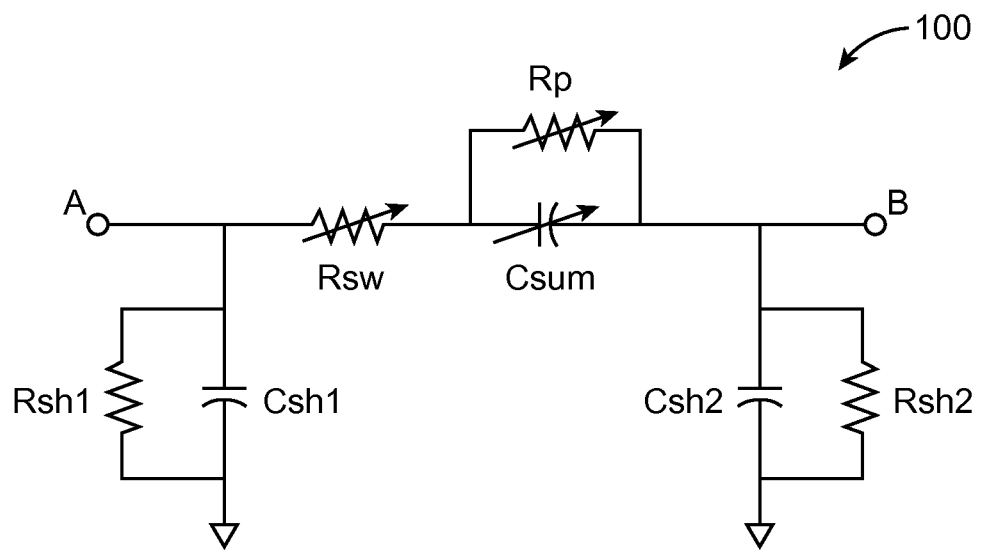
FIG. 14B is a diagram of an equivalent circuit model for the capacitor array circuit of FIG. 16A in accordance with an embodiment of the present invention.

FIG. 14B shows an exemplary equivalent circuit model for DUT 100 of FIG. 14B. As shown in FIG. 14B, a variable resistor Rsw may represent the resistance associated with switches 152, a variable capacitor Csum may represent the total capacitance associated with the active capacitors, and a variable resistor Rp may represent parasitic resistances associated with the capacitors. Additional shunt modeling components such as resistor Rsh1 and capacitor Csh1 may be coupled in parallel from port A to ground, whereas shunt modeling components such as resistor Rsh2 and capacitor Csh2 may be coupled in parallel from port B to ground. The values of each modeling component in FIG. 14B may be extracted from the measured S parameters by converting the measured S parameters to other two-port parameters and using the converted parameters as inputs to predetermined equations.

At step 310 (FIG. 8), the computed equivalent circuit model of DUT 100 may be used to help optimize the antenna design of device 10. For example, statistical data analysis may be performed by varying the values of each modeling component while simulating the wireless performance of device 10, signal interference generated due to the presence of antenna tuning element 100 in device 10 may be accurately simulated/characterized, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a test system to test a device under test, wherein the test system includes a test fixture to which the device under test is attached during testing, the method comprising:
    calibrating the test fixture to remove systematic effects associated with the test fixture;
    when the systematic effects associated with the test fixture have been removed, characterizing the device under test, wherein the device under test comprises an antenna tuning element, wherein characterizing the device under test comprises characterizing the antenna tuning element, wherein the test system further includes a radio-frequency tester;
    while the device under test is attached to the test fixture, obtaining radio-frequency measurements from the device under test with the radio-frequency tester, wherein obtaining the radio-frequency measurements from the device under test comprises gathering scattering parameter data from the device under test.

2. The method defined in claim 1, wherein the radio-frequency tester comprises a vector network analyzer, and wherein obtaining the radio-frequency measurements comprises obtaining the radio-frequency measurements from the device under test with the vector network analyzer.

3. The method defined in claim 1, further comprising:
    calibrating the radio-frequency tester using a coaxial standard.

4. A method for using a test system to test a device under test, wherein the test system includes a test fixture to which the device under test is attached during testing, the method comprising:
    calibrating the test fixture to remove systematic effects associated with the test fixture;
    when the systematic effects associated with the test fixture have been removed, characterizing the device under test, wherein the device under test comprises an antenna tuning element, wherein characterizing the device under test comprises characterizing the antenna tuning element, wherein the test system further includes a radio-frequency tester;
    while the device under test is attached to the test fixture, obtaining radio-frequency measurements from the device under test with the radio-frequency tester, wherein the test fixture includes a substrate having at least one transmission line path configured to convey radio-frequency test signals between the radio-frequency tester and the device under test, and wherein calibrating the test fixture comprises calibrating transmission line path characteristics associated with the substrate using a THRU-REFLECT-LINE (TRL) method.

5. A method for using a test system to test a device under test, wherein the test system includes a test fixture to which the device under test is attached during testing, the method comprising:
    calibrating the test fixture to remove systematic effects associated with the test fixture;
    when the systematic effects associated with the test fixture have been removed, characterizing the device under test, wherein the device under test comprises an antenna tuning element, wherein characterizing the device under test comprises characterizing the antenna tuning element, wherein the test fixture includes a substrate and a test socket that is attached to the substrate, wherein the test socket is configured to receive the device under test during testing, wherein calibrating the test fixture comprises calibrating the test fixture to remove systematic effects associated with the substrate and the test socket, and wherein the test system further includes a test host and a radio-frequency tester;
    while the device under test is attached to the test fixture, obtaining radio-frequency measurements from the device under test with the radio-frequency tester; and
    with the test host, obtaining an equivalent circuit model for the test socket based on the obtained radio-frequency measurements and known frequency response characteristics associated with the device under test.

6. The method defined in claim 5, wherein characterizing the device under test comprises obtaining an equivalent circuit model for the device under test using the obtained radio-frequency measurements while taking into account systematic effects associated with the test fixture and the radio-frequency tester.

* * * * *